(12) United States Patent
Meade (10) Patent No.: US 8,569,149 B2
(45) Date of Patent: Oct. 29, 2013

(54) METHOD OF TREATING A SEMICONDUCTOR DEVICE

(75) Inventor: Roy Meade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 460 days.

(21) Appl. No.: 12/775,228

(22) Filed: May 6, 2010

(65) Prior Publication Data

US 2011/0275195 A1 Nov. 10, 2011

(51) Int. Cl.
*H01L 21/322* (2006.01)

(52) U.S. Cl.
USPC .................. 438/473; 438/477; 257/E21.318; 257/E21.321

(58) Field of Classification Search
USPC ................................................ 438/471–477
See application file for complete search history.

(56) References Cited

U.S. PATENT DOCUMENTS

| | | | | |
|---|---|---|---|---|
| 5,972,765 | A * | 10/1999 | Clark et al. | 438/308 |
| 6,017,806 | A | 1/2000 | Harvey | |
| 6,432,847 | B1 * | 8/2002 | Tsang et al. | 438/795 |
| 6,949,433 | B1 * | 9/2005 | Hidehiko et al. | 438/261 |
| 2007/0105703 | A1 * | 5/2007 | Bookbinder et al. | 501/54 |
| 2009/0069611 | A1 | 3/2009 | Lukehart | |
| 2009/0074374 | A1 * | 3/2009 | Fujiue et al. | 385/142 |
| 2009/0263590 | A1 * | 10/2009 | Kaino et al. | 427/515 |
| 2010/0025832 | A1 * | 2/2010 | Atnip et al. | 257/682 |

OTHER PUBLICATIONS

Barbe, M., et al., "Photo-Induced Dissociation and Optical Cross Section of Si-H and S-H Complexes in GaAs and AlGaAs", Materials Research Society, Symposium F, vol. 719, (Spring, 2002), F8.8.1-F8.8.6.

Burgess, Daniel S., "IR Radiation Breaks Si-H Vibrational Stretch Mode", http://www.photonics.com/Content/ReadArticle.aspx?ArticleID-25930, (May 19, 2006), 1024-1026.

Cao, Min, et al., "Study on Hydrogenation of Polysilicon Thin Film Transistors by Ion Implantation", IEEE Transaction on Electron Devices, 42(6), (Jun. 1995), 1134-1140.

Chabal, Y. J, "High-resolution infrared spectroscopy of adsorbates on semiconductor surfaces: Hydrogen on Si(100) and Ge(100)", Surface Science, 168(1-3), (Mar. 3, 1986), 594-608.

Cheng, Kangguo, et al., "Approach to enhance deuterium incorporation for improved hot carrier reliability in metal-oxide-semiconductor devices", Appl. Phys. Lett., 77(15), (2000), 2358-2360.

Hess, K., et al., "Giant Isotope Effect in Hot Electron Degradation of Metal Oxide Silicon Devices", IEEE Transactions on Electron Devices, 45(2), (Feb. 1998), 406-416.

(Continued)

*Primary Examiner* — Calvin Choi
(74) *Attorney, Agent, or Firm* — Schwegman, Lundberg & Woessner, P.A.

(57) ABSTRACT

A method of treating a semiconductor device wherein there is provided a semiconductor device, the semiconductor device being at least in part chemically bonded to an undesired chemical species. The semiconductor device is subjected to light of a wavelength sufficient to cleave at least some of the chemical bonds between the semiconductor device and the undesired chemical species, and the semiconductor device is exposed to a source of a desired chemical species, such that the semiconductor device becomes at least in part chemically bonded to the desired chemical species.

30 Claims, 5 Drawing Sheets

(56) References Cited

OTHER PUBLICATIONS

Hull, R., "", Properties of Crystalline Silicon, INSPEC, The Institution of Engineering and Technology, (1999), 151-71.

Liu, Z., et al., "Desorption of H from Si(111) by Resonant Excitation of the Si-H Vibrational Stretch Mode", Science, 312(5776), (May 19, 2006), 1024-1026.

Lyding, J. W, et al., "Reduction of Hot Electron Degradation in Metal Oxide Semiconductor Transistors by Deuterium Processing", Applied Physics Letters, 68(18), (Apr. 1996), 2526-2528.

Stesmans, A., "Integration of Pb defects at the (111) Si/Sio2 interface with molecular hydrogen: Simultaneous action of passivation and dissociation.", Journal of Applied Physics, 88(1), (Jul. 1, 2000), 489-497.

* cited by examiner

METHOD OF TREATING A SEMICONDUCTOR DEVICE

BACKGROUND OF THE INVENTION

The ability to manufacture semiconductor devices in great quantity and at small scale has revolutionized the electronics industry. There is a continual need to maximize the quality and lifetime of semiconductor devices. During the operation of a semiconductor device, a major cause of performance degradation is the "hot electron effect", also referred to as "hot carrier effects", in which high-energy electrons (or holes) cause defects in the semiconductor device. A variety of explanations have been advanced to describe the mechanism of this phenomenon, including the generation of traps, and the creation of dangling-bonds. For example, in transistor semiconductor devices, the performance degradation likely caused by the hot electron effect can include a slow change in the threshold voltage, a decrease in transconductance, and leakage.

Hydrogen may be found in semiconductor devices as a result of exposure to hydrogen during and after the manufacturing process. This exposure allows hydrogen to fill defects in the lattice-structure of the semiconductor device, and the general process is referred to as passivation, with hydrogen being the passivating species in this particular example. Passivation replaces dangling-bonds in the semiconductor device with chemical bonds between the semiconductor device and the passivating species. Passivation of a semiconductor device can improve its performance, including by making behavior characteristics of the device more consistent, by increasing the lifetime of the device, and by making operating characteristics of the device more desirable. Passivation of a semiconductor device generally occurs during the manufacturing process of the device, but passivation can occur at any time.

The hot electron effect may be mitigated by passivating a semiconductor device with a passivating species other than hydrogen. For example, it is known that the use of deuterium as a passivating species diminishes the hot electron effect. Lynding et al. noted that replacing hydrogen with deuterium during the final wafer sintering process reduces hot electron degradation effects in metal oxide semiconductor transistors. (See, "Reduction of Hot Electron Degradation in Metal Oxide Semiconductor Transistors by Deuterium Processing" *Applied Physics Letters*, Vol. 68, No. 18, Apr. 29, 1996, pp. 2526-2528.) Hess et al. correlated reduced hot electron degradation with the use of deuterium instead of hydrogen for passivation. (See, "Giant Isotope Effect in Hot Electron Degradation of Metal Oxide Silicon Devices" *IEEE Transactions on Electron Devices*, Vol. 45, No. 2, February 1998, pp. 406-416, and "Reductions of Hot Electron Degradation in Metal Oxide Semiconductor Transistors by Deuterium Processing" *Applied Physics Letters*, Vol. 68, No. 18, April 1996, 2526-2528.)

While deuterium passivation moderates the hot electron effect, deuterium can only chemically bond at the appropriate sites of the semiconductor device if those sites are available for chemical bonding. The ubiquity of hydrogen in gases that have not been mostly or completely purified, and also in ambient air, means that unless significant effort is used in isolating the semiconductor device from hydrogen, at least partial if not complete hydrogen passivation of dangling-bonds will occur, thus at least partially if not completely preventing deuterium passivation of the device. In order to allow for partial or complete replacement of one passivating species with another, at least some of the chemical bonds between the semiconductor device and the undesired passivating species must be broken. Therefore, current techniques for deuterium passivation generally include subjecting the device to heat, often near about 350-600 degrees C., in order to thermally cleave chemical bonds between the semiconductor device and hydrogen, creating dangling-bonds which could then be passivated by deuterium, (see, e.g. U.S. Pat. No. 6,017,806 (Harvey)). This heat treatment is often performed in the presence of deuterium in the form of a gaseous deuterium source or in the form of a film or a layer, in a solid or liquid or vapor state, which contains a deuterium source, such that deuterium may diffuse to the appropriate chemical bonding sites in the semiconductor device, and such that hydrogen may diffuse away from those sites, (see, e.g., U.S. Pat. No. 5,972,765 (Clark et al.)). In the use of these techniques, the quantity of chemical bonding sites that become occupied by deuterium is generally proportional to the amount of time that the semiconductor device is subjected to the heat treatment. These techniques are problematic because, among other issues, high temperatures can create thermal defects in the devices, thereby potentially reducing yield of the manufacturing process or decreasing quality. Also, high temperature treatment is non-selective, in that the entire device may be heated, imparting thermal energy to the entire device. As a result, thermal energy is imparted to other chemical bonds in the semiconductor device, possibly thermally cleaving these chemical bonds as well, including chemical bonds between the semiconductor device and deuterium or another desired passivating species.

Another less common method for cleaving chemical bonds between a semiconductor device and an undesired chemical species prior to passivation with a desired chemical species involves the use of an electrical prestress, as described by Cheng et al. in *Applied Physics Letters*, Vol. 77, No. 15, October 2000, 2358-2360. The prestress technique subjects a semiconductor device to electrical stress of a strength and duration sufficient to allow the hot electron effect to cleave a desired amount of chemical bonds between the semiconductor device and hydrogen. The prestress technique is time-consuming, and also generally requires probing of the semiconductor device to permit subjection of the device to the electrical stress, which can be both inconvenient and also impractical, e.g., especially for large numbers of densely distributed semiconductor devices, as found in most integrated circuits.

U.S. Patent Publication No. 2009/0069611 (Lukehart) describes a method of forming reactive sites on an adsorbate-substrate by non-thermal, non-electronic resonant photodesorption of a gas from the adsorbate-substrate; reacting the reactive sites with a functional radical; and cyclically repeating the steps of forming and reacting. The method is not disclosed or suggested to be used to passivate a semiconductor device following photodesorption of a gas. Additionally, the method is not disclosed or suggested to be used to passivate any material with deuterium after photodesorption of a gas.

Infrared light tuned to a particular frequency is known to selectively cleave chemical bonds between silicon and hydrogen. (See, e.g., Liu et al., *Science*, May 2006, 312, 1024-1026). This reference does not, however, disclose or suggest that after the method of chemical bond-cleavage between silicon and hydrogen, subsequent passivation with another chemical species may be performed.

BRIEF DESCRIPTION OF THE DRAWINGS

The figures illustrate generally, by way of example, but not by way of limitation, various embodiments and examples discussed in the present document.

DETAILED DESCRIPTION OF THE INVENTION

The present invention provides a method of semiconductor device manufacturing. The method includes providing a semiconductor device. The semiconductor device is at least in part chemically bonded to an undesired chemical species. The method also includes exposing the semiconductor device to a source of a desired chemical species. The method also includes subjecting the semiconductor device to light of a wavelength sufficient to cleave at least some of the chemical bonds between the semiconductor device and the undesired chemical species, such that the semiconductor device becomes at least in part chemically bonded to the desired chemical species.

The present invention provides a method of semiconductor device passivation. The method includes providing a semiconductor device. The semiconductor device is at least in part chemically bonded to hydrogen. The method also includes exposing the semiconductor device to a source of deuterium. The method also includes subjecting the semiconductor device to light of a wavelength sufficient to cleave at least some of the chemical bonds to hydrogen, such that the semiconductor device becomes at least in part chemically bound to deuterium in place of hydrogen.

The presently disclosed subject matter relates to a method of treating semiconductor devices. When describing the method of treating semiconductor devices, the following terms have the following meanings, unless otherwise indicated. Other terms have the meanings normally ascribed by a person of ordinary skill in the art.

As used herein, "fluence" refers to the radiative flux integrated over time, specifically the number of radiative particles (such as photons) that intersect a unit area.

As used herein, "light" refers to electromagnetic radiation of any wavelength, whether visible or not.

As used herein, "reservoir film" refers to layers or coatings of materials, which provide a desired chemical species. The time frame over which a desired chemical species is provided is not limited.

As used here, "semiconductor" refers to a material that includes but need not be exclusively a chemical compound or chemical compounds, said chemical compound or compounds when pure having an electrical conductivity between that of a conductor and an insulator. Semiconductor materials can be undoped, n-doped, or p-doped, and include but are not limited to, in their pre- or post-doped state, at least one of: Si, SiC, Ge, GaAs, AlGaAs, InAs, InAt, InP, C, Ge, SiGe, AlSb, AlAs, AlN, AlP, BN, BP, BAs, GaSb, GaAs, GaN, GaP, InSb, InN, AlGaAs, $Al_xGa_{1-x}As$, InGaAs, $In_xGa_{1-x}As$, InGaP, AlInAs, AlInSb, GaAsN, GaAsP, AlGaN, AlGaP, InGaN, AlGaP, InGaN, InAsSb, InGaSb, AlGaInP, AlGaAsP, AlInAsP, AlGaAsN, InGaAsN, InAlAsN, GaAlAsN, GaAsSbN, GaInNAsSb, or GaInAsSbP.

As used herein, "semiconductor device" refers to one or more semiconductor devices at any stage of manufacture. It can also refer to an object that includes multiple semiconductor devices. A semiconductor device includes one or more of, but is not limited to, a MOS device (metal oxide semiconductor device, traditionally including but not limited to a layer of semiconductor material onto which is grown a layer of dielectric followed by a layer of a conductor), a transistor (including a device whose uses include amplification or switching of electronic signals), a MOSFET (metal oxide semiconductor field effect transistor), a TFT (thin film transistor), a diode (a device which, in general, only conducts current in one direction), an LED (light emitting diode), a polysilicon resistor (a resistor made of doped polysilicon), a bipolar transistor, an integrated circuit (a miniaturized electronic circuit containing multiple semiconductor devices), a microprocessor (an integrated circuit), memory including RAM (random access memory) or ROM (read only memory) memory, or a mixture thereof.

There are several advantages of using light to cleave chemical bonds. One advantage is that when the light used is tuned to a particular frequency, only chemical bonds that resonate at or near that frequency will be given the most energy by the light, and therefore will be the first chemical bonds to be cleaved. Therefore, by using a specific frequency of light, a high degree of selectivity can be achieved as to what types of chemical bonds are cleaved. In one non-limiting example, light could be adjusted to a frequency which is absorbed by chemical bonds between a semiconductor device and hydrogen, but not by chemical bonds between a semiconductor device and deuterium, nor by chemical bonds between the chemical species that compose the bulk of the semiconductor device (e.g., silicon-silicon), thereby specifically cleaving only the chemical bonds between the semiconductor device and hydrogen. The light that is not absorbed by chemical bonds can simply pass through the semiconductor device or be reflected. This also means that, in general, by using light to cleave chemical bonds, there can be little or no generation of heat, especially in areas of the semiconductor device not near to chemical bonds which the light has been tuned to resonate with. By controlling the heat generation and the use of heat in semiconductor device manufacturing, introduction of thermal defects can be avoided, and low-temperature manufacturing techniques can be more easily achieved.

Embodiments of the present invention are not restricted to the use of deuterium as a passivating species, nor are they limited by any theoretical explanation relating to why or how deuterium operates as an effective passivating species, nor by any statement of advantages deuterium passivation can have over traditional hydrogen passivation. Deuterium can be a highly advantageous passivating species for use in semiconductor device manufacturing. Identical semiconductor devices passivated with deuterium instead of hydrogen exhibit nearly identical electrical performance characteristics, but they can have very different degradation dynamics, with deuterium-passivated semiconductor devices sometimes showing an improvement of practical operating lifetime at factors of 10 and even of 50 over the corresponding hydrogen-passivated semiconductor devices. This dramatic difference is commonly believed to be due to the ability of deuterium-passivated semiconductor devices to be more resistant to the hot electron effect. One explanation advanced for this resilience is the similarity of the silicon-deuterium chemical bond resonance frequency with that of the silicon phonon, which can enable energy absorbed by the silicon-deuterium chemical bond to be easily dispersed into the lattice structure of the silicon.

Despite the notable and desirable advantages deuterium can have over hydrogen as a passivant in semiconductor device manufacturing, the use of deuterium has not found widespread use due to the difficulty of selectively, in a way that does not damage the device, cleaving silicon-hydrogen chemical bonds to allow deuterium to passivate the semiconductor device. Heat is generally used to cleave silicon-hydrogen chemical bonds, but it is difficult to preferentially thermally cleave silicon-hydrogen chemical bonds and passivate with deuterium since the binding energy between hydrogen and deuterium with silicon are very similar, thus the traditional method of passivation using heat is relatively unselective toward the chemical bond that is desired to be cleaved. Additionally, the heating process is generally applied to the entire device, which imparts thermal energy to all the chemical bonds that compose the device; as a result, the use of heat to cleave silicon-hydrogen chemical bonds introduces thermal defects in semiconductor devices. Therefore, an ideal passivation method has a minimal requirement for heating. Another negative aspect of a traditional method is that for effective deuterium passivation, extended heating periods are generally used, allowing deuterium to diffuse into the device and allowing hydrogen to diffuse out of the device; an extended heating period makes thermal defects even more likely in the semiconductor device. The less common method of electric prestress for cleaving silicon-hydrogen chemical bonds is impractical for large scale implementation due to the inconvenient requirement to probe the semiconductor device to permit each semiconductor device to be subjected to the required electrical stress for the required duration. Embodiments of the present invention require no probing to cleave silicon-hydrogen chemical bonds. Embodiments of the present invention can be conveniently implemented on a large scale, to cleave silicon-hydrogen chemical bonds in many semiconductor devices simultaneously. Embodiments of the present invention selectively cleave generally only silicon-hydrogen chemical bonds in semiconductor devices with no use of heat or the use of comparatively little heat. Embodiments of the present invention can satisfy the long-felt needs of the semiconductor device manufacturing industry by making deuterium passivation a more practical reality.

Reference will now be made in detail to embodiments of the invention. While the invention will be described in conjunction with the enumerated claims, it will be understood that they are not intended to limit the invention to those claims. On the contrary, the invention is intended to cover all alternatives, modifications, and equivalents, which can be included within the scope of the invention as defined by the claims.

References in the specification to "one embodiment", "an embodiment", "an example embodiment", etc., indicate that the embodiment described can include a particular feature, structure, or characteristic, but every embodiment does not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In various embodiments, the present invention provides a method of treating a semiconductor device that includes the steps of providing a semiconductor device, the semiconductor device being at least in part chemically bonded to an undesired chemical species; exposing the semiconductor device to a source of a desired chemical species, the desired chemical species being desired to be at least in part chemically bonded to the semiconductor device; and, subjecting the semiconductor device to light of a wavelength sufficient to cleave at least some of the chemical bonds between the semiconductor device and the undesired chemical species, such that the semiconductor device becomes at least in part chemically bonded to the desired chemical species. In some embodiments, the method can be performed during the manufacturing of the semiconductor device; therefore, the semiconductor device can be at an intermediate stage of manufacturing when the method is performed. The steps of exposing the semiconductor device to a desired chemical species and exposing the semiconductor device to light can occur in any order, and with any amount of temporal overlap between the two steps, including both steps being performed separately, both steps being performed at the same time, and including any degree of concurrent performance between the two steps. In some embodiments, the present invention also includes situations where one step is completely subsumed temporally by another step. Thus, in some examples, light exposure to the semiconductor device could begin, then, concurrently, exposure of the semiconductor device to a source of a desired chemical species could begin, then exposure of the semiconductor device to a source of the desired chemical species could end, and then the light exposure could cease. There is no limitation to the number of times the steps can be performed; therefore, in some embodiments, the steps can be performed multiple times, and not necessarily in the same order nor with the same temporal overlap for each repetition of the steps. Additionally, in some examples, if films or coatings are used to provide the desired chemical species, the film does not necessarily have to be removed at the end of manufacture, therefore the step including exposure of the semiconductor device to a source of a desired chemical species can occur during the entire lifetime of the device.

In the present invention, there is no limitation to the number of semiconductor devices which can be treated by the method simultaneously. Indeed, a major convenience of some embodiments of the invention can be the ability to passivate many semiconductor devices simultaneously. Thus, in some embodiments, the present invention is envisioned to encompass treatment of many semiconductor devices simultaneously. In some embodiments, a large quantity of semiconductor devices can be manufactured in an integrated circuit at one time, and passivated simultaneously. In other embodiments, a semiconductor structure can be passivated, after which it can be cut, chopped, or broken into multiple semiconductor devices, sometimes after passing through additional manufacturing steps. In another embodiment, one single semiconductor device can be passivated.

Another embodiment of the present invention provides a method of treating a semiconductor device that includes the steps of providing a semiconductor device, the semiconductor device being at least in part chemically bonded to an undesired chemical species; exposing the semiconductor device to a source of a desired chemical species, the desired chemical species being desired to be at least in part chemically bonded to the semiconductor device; and, subjecting the semiconductor device to light of a wavelength sufficient to cleave at least some of the chemical bonds between the semiconductor device and the undesired chemical species, such that the semiconductor device becomes at least in part chemically bonded to the desired chemical species.

Various embodiments of the present invention provide a method of treating a semiconductor device that includes the steps of providing a semiconductor device, the semiconductor device being at least in part chemically bonded to an undesired chemical species; exposing the semiconductor device to a source of a desired chemical species, the desired chemical species being desired to be at least in part chemically bonded to the semiconductor device; and, subjecting the semiconductor device to light of a wavelength sufficient to cleave at least some of the chemical bonds between the semiconductor device and the undesired chemical species, such that the semiconductor device becomes at least in part chemically bonded to the desired chemical species. In some embodiments, the exposure of the semiconductor device to the source of the desired chemical species and the subjection of the semiconductor device to the light can take place concurrently for at least part of the duration of the two steps. In some examples, the undesired chemical species of the present invention includes H (hydrogen). In some examples, the desired chemical species includes D (deuterium). In some embodiments, the desired chemical species includes a halogen atom. In some embodiments of the present invention, the source of the desired chemical species includes a gas that provides the desired chemical species. In some embodiments, the source of the desired chemical species includes a gas that provides the desired chemical species to the semiconductor device. In some embodiments, the source of the desired chemical species includes a source that provides the desired chemical species mixed with an inert carrier. In some examples of the present invention, the source of the desired chemical species can be in any phase state, including gas, in some examples the source of the desired chemical species can sometimes not be pure, in some examples can consist of more than one source of the desired chemical species, and in some examples the source of the desired chemical species can be mixed with an inert carrier of any phase state, including gas, or with a medium in any phase state that is less reactive with the semiconductor device than the source of the desired chemical species.

In some embodiments, the source of the desired chemical species includes $D_2$. In another embodiment, the source of the desired chemical species includes $D_2O$. In some examples, the semiconductor device is at an intermediate stage of manufacturing. In another example, the wavelength of the light is in the infrared region. In some examples, the wavelength of the light is about 4.8 micrometers. In yet another example, the light is polarized. In other examples, the light is polarized at about 0 degrees.

In some embodiments, the desired chemical species includes at least one of: D, F, Cl, Br, I, NO, $NO_2$, a hydrocarbon, or a nitrogen-containing compound. In some embodiments, the source of the desired chemical species includes at least one of: $D_2$, $D_2O$, $CD_4$, $CDCl_3$, $CD_2Cl_2$, $SiD_4$, $SiDCl_3$, $SiCl_2D_2$, $ND_3$, DCl, acetone-$d_6$, acetonitrile-$d_3$, $CD_3OD$, DMSO-$d_6$, DMF-$d_7$, benzene-$d_6$, cyclohexane-$d_{12}$, pyridine-$d_5$, a deuterated hydrocarbon, a deuterated amine, a deuterated nitrogen-containing compound, deuterium radicals, deuterium ions, or a deuterium plasma. In some embodiments, the source of the desired chemical species can be provided via ion implantation, as described by Cao et al. (see, *IEEE Transactions on Electron Devices*, Vol. 42, No. 6, June 1995). In some embodiments, "semiconductor" means a material that includes but need not be exclusively a chemical compound or chemical compounds, said chemical compound or compounds when pure having an electrical conductivity between that of a conductor and an insulator.

In some embodiments, the present invention is envisioned as encompassing the use of films, such as layers or coatings of materials, which provide a desired chemical species, and thus such films are referred to as reservoir films. In some embodiments, the present invention is envisioned as encompassing the use of films which are a source of deuterium, such as layers or coatings of materials which provide deuterium, and thus such films are referred to as deuterium reservoir films. In some examples, the reservoir film includes the source or one of the sources of the desired chemical species, and in other examples, the reservoir film is not the source of the desired chemical species, or is an additional source. In some examples, these coatings are not necessarily present for transient times, and can be left on the device throughout its lifetime or for a lesser amount of time. In some examples, this provides a long-term source of a desired chemical species to the semiconductor device, such that if new dangling bonds form in the semiconductor device, they can encounter and chemically bond with the desired chemical species, as opposed to an undesired chemical species, e.g., H. In some examples, the reservoir film can be both the source of the desired chemical species during or after the manufacturing process, and a lifetime source of desired chemical species. Thus, in some examples, the method includes formation of a deuterium reservoir film on the semiconductor device; and, in a related embodiment, the deuterium reservoir film is a source of deuterium for up to the lifetime of the semiconductor device. In another embodiment, deuterium is the desired chemical species, wherein a deuterium reservoir film is the source of the desired chemical species.

In some embodiments, the desired chemical species is desired to be bonded to the semiconductor device in place of the undesired chemical species. In some embodiments, the further steps of manufacturing the semiconductor device do not include temperatures which exceed the temperature required to dissociate the chemical bond between the semiconductor device and the desired species. In an alternative embodiment, the method includes heating to a temperature appropriate to increase the rate of diffusion of the undesired chemical species out of the semiconductor device and to increase the rate of diffusion of the desired chemical species into the semiconductor device. In another embodiment, the method includes heating the semiconductor device to a temperature appropriate to assist with the cleavage of chemical bonds between the semiconductor device and the undesired chemical species. In some examples, the method includes heating to a temperature of approximately 400 degrees C. Some embodiments of the present invention include one or both of heating the semiconductor device to assist with the cleavage of chemical bonds between the undesired chemical species and the semiconductor device, or heating the semiconductor device to assist with the formation of chemical bonds between the desired chemical species and the semiconductor device. In yet another alternative embodiment, the method includes the use of a magnetic field, an electrical field, a bias, or a combination thereof, to increase the rate of diffusion of the undesired chemical species out of the semiconductor device.

One embodiment of the current invention provides a method of semiconductor device passivation, including the steps of providing a semiconductor device, the semiconductor device being at least in part chemically bonded to hydrogen; exposing the semiconductor device to a source of deuterium; and, subjecting the semiconductor device to light of a wavelength sufficient to cleave at least some of the chemical bonds to hydrogen, such that the semiconductor device becomes at least in part chemically bound to deuterium in place of hydrogen. In other related examples, the source of deuterium includes at least one of: $D_2$, $D_2O$, $CD_4$, $CDCl_3$, $CD_2Cl_2$, $SiD_4$, $SiDCl_3$, $SiCl_2D_2$, $ND_3$, DCl, acetone-$d_6$, acetonitrile-$d_3$, $CD_3OD$, DMSO-$d_6$, DMF-$d_7$, benzene-$d_6$, cyclohexane-$d_{12}$, pyridine-$d_5$, a deuterated hydrocarbon, a deuterated amine, a deuterated nitrogen-containing compound, deuterium radicals, deuterium ions, or a deuterium plasma. In some embodiments, the source of the desired chemical species can be provided via ion implantation, as described by Cao et al. (see, *IEEE Transactions on Electron Devices*, Vol. 42, No. 6, June 1995).

Another embodiment of the present invention provides a method for passivation of silicon wafers, including the steps of providing a silicon wafer that has at least some chemical bonds between silicon and hydrogen; and exposing the silicon wafer to IR energy of a wavelength sufficient to dissociate at least some of the chemical bonds between silicon and hydrogen, and exposing the silicon wafer to a source of a deuterium, such that at least some chemical bonds form between silicon and deuterium in place of chemical bonds between silicon and hydrogen.

In an embodiment set forth below, the resonant excitation and cleavage of the chemical bonds between silicon and hydrogen from a silicon surface using tunable infrared light is reported. Reference to Figures in these examples is not intended to limit the invention in any way. The wavelength dependence of the chemical bond-cleavage yield peaks at 0.26 eV, the energy of the silicon-hydrogen chemical bond vibrational stretch mode. The chemical bond-cleavage yield is quadratic in the infrared light intensity. A strong hydrogen versus deuterium isotope effect rules out thermal chemical bond-cleavage mechanisms, and electronic effects are not applicable in this low energy regime.

The silicon-hydrogen chemical bond is perpendicular to the silicon surface, with a bond energy estimated between 3.15 eV and 3.35 eV, and a vibrational stretch energy of 0.26 eV at the terrace sites. In experiments, the silicon-hydrogen chemical bond vibrational stretch mode can be resonantly excited by infrared light. The silicon substrate is transparent to mid-infrared light illumination, minimizing electronic excitation and direct laser-induced heating. Because hydrogen chemical bond-cleavage is an important component of silicon chemical vapor deposition, controlling silicon-hydrogen chemical bond-cleavage can enable control over aspects of epitaxial growth on silicon. In particular, the vibrational energy of a silicon-hydrogen chemical bond at the terrace site of the silicon surface differs from that at the step site by 51.8 cm$^{-1}$, which enables site-selective chemical bond-cleavage of silicon-hydrogen chemical bonds by infrared light. Such a photolytic process can, among other things, efficiently treat a large area, and modify the type of sites available for epitaxial growth.

For example, the process can be performed in an ultra-high vacuum system at room temperature. The base pressure can be about $3.0 \times 10^{-10}$ Torr. The sample can be prepared in air using hydrofluoric acid etching to protect the silicon surface from oxidation and contamination, and then cleaned by direct-current heating in the ultra-high vacuum chamber. The clean surface can be verified by the strong silicon(111)-7×7 low-energy electron diffraction pattern. Ultra-high purity hydrogen gas can be introduced into the ultra-high vacuum chamber. A tungsten filament at 2000 K can be used to dissociate $H_2$ molecules, thus efficiently forming the silicon-hydrogen chemical bonds at the silicon(111) surface. After a hydrogen dose of $3 \times 10^{-6}$ Torr for 120 seconds, an area of silicon surface measuring 5 mm by 4 mm can be uniformly chemically bonded to hydrogen atoms, which can be evidenced by the silicon(111)-1×1 low-energy electron diffraction pattern and the uniform chemical bond-cleavage behavior at different spots when all other chemical bond-cleavage conditions are kept the same. Thermal chemical bond-cleavage spectra show only one peak at about 820 K, indicating that hydrogen is chemically bonded to silicon exclusively as a monohydride phase on the silicon surface.

In an embodiment, a free-electron laser (FEL) can be utilized to provide a maximum of 100 mJ per FEL macropulse at a repetition rate of 30 Hz. Each FEL macropulse can be composed of about $10^4$ micropulses of 1 picosecond duration, spaced 350 picoseconds apart. The spectral width of the FEL emission can be about 50-90 cm$^{-1}$. The infrared light can be guided into the chamber through a $CaF_2$ viewport and focused onto the sample with a spot size of 0.8 mm. Its power and polarization could be adjusted with an attenuator and polarizer outside the chamber. The sample surface can be positioned to make a 30° angle with the linearly polarized beam. The total electric field above the silicon surface is the sum of the incident and the reflected fields. For the silicon substrate with refractive index 3.42 and this incident angle of 60°, the direction of the total electric field above the silicon surface is close to the surface normal; namely, the direction of the silicon-hydrogen chemical bond. The field projection in this direction is $(1+r_p)E \cos \theta \cos 30°$, with E being the incident field, $r_p$ the reflection coefficient of the p-polarized component, and $\theta$ the angle between the FEL electric field and the incident plane. The effective FEL fluence in the direction of the silicon-hydrogen chemical bond can be varied by changing either the incident intensity $E^2$ or the polarization angle $\theta$.

The sample can be exposed to the FEL illumination at room temperature, and hydrogen whose hydrogen-silicon chemical bonds were consequently cleaved was pumped away by the ion pump at the same time. In an embodiment, an infrared pyrometer focused on the sample detected no temperature rise during chemical bond-cleavage, showing no FEL-induced heating of the bulk sample, though not ruling out a local transient temperature increase. A quadruple mass analyzer was employed to record the $H_2$ partial pressure as a function of time once the FEL shutter was open. After chemical bond-cleavage, an experimental parameter, such as the FEL wavelength or polarization, was varied, and the FEL focus was moved to a new sample position that had not been exposed to the FEL illumination. When the FEL beam was not incident on the silicon surface, no chemical bond-cleavage signal was measured, indicating that there was no contribution from scattered FEL radiation.

Figure 1:
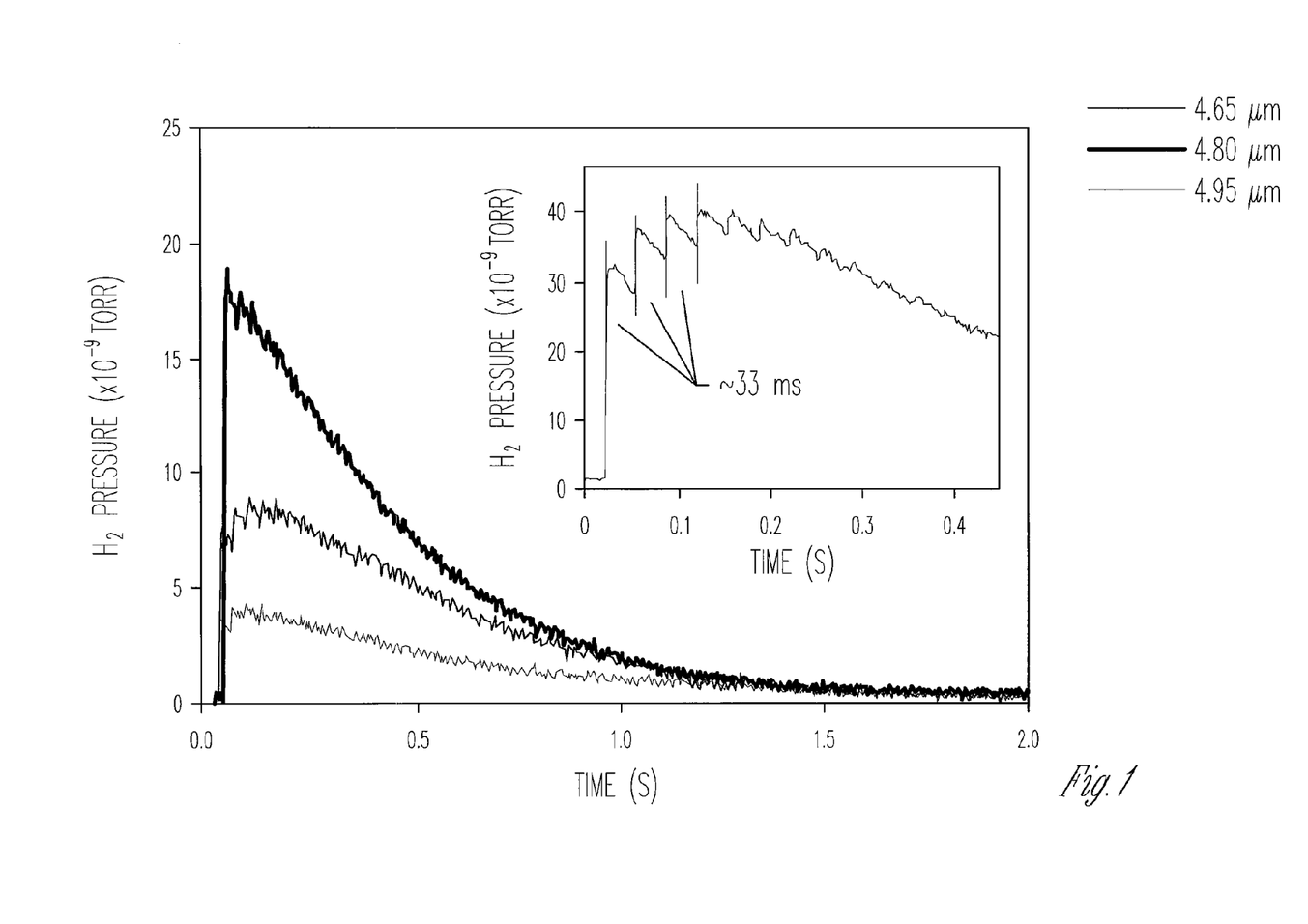
FIG. 1 illustrates hydrogen-silicon chemical bond-cleavage at three light wavelengths.

In an embodiment of the inventive process, the following procedures were carried out, and the results are shown in the Figures as described below. To study the wavelength dependence of light-induced cleavage of the chemical bonds between silicon and hydrogen, the $H_2$ partial pressure was monitored as a function of time over a range of FEL wavelengths, with the fluence kept fixed and the polarization set to $\theta=0°$ (FIG. 1). The signal quickly rose to its peak, then decayed exponentially with a rate in agreement with the pumping speed of the vacuum system. The fine structure of the chemical bond-cleavage curves (the inset of FIG. 1) features step-like increases. The interval of 33 microseconds is in good agreement with the 30-Hz repetition rate of the FEL macropulse, indicating that these increases resulted from chemical bond-cleavage by each FEL macropulse. The $H_2$ partial pressure is a measure of the total number of $H_2$ molecules in the ultra-high vacuum chamber. Therefore, the magnitude of each jump is taken as a measure of the number of $H_2$ molecules formed by cleavage of hydrogen-silicon chemical bonds by each FEL macropulse; i.e., the chemical bond-cleavage yield.

Figure 2:
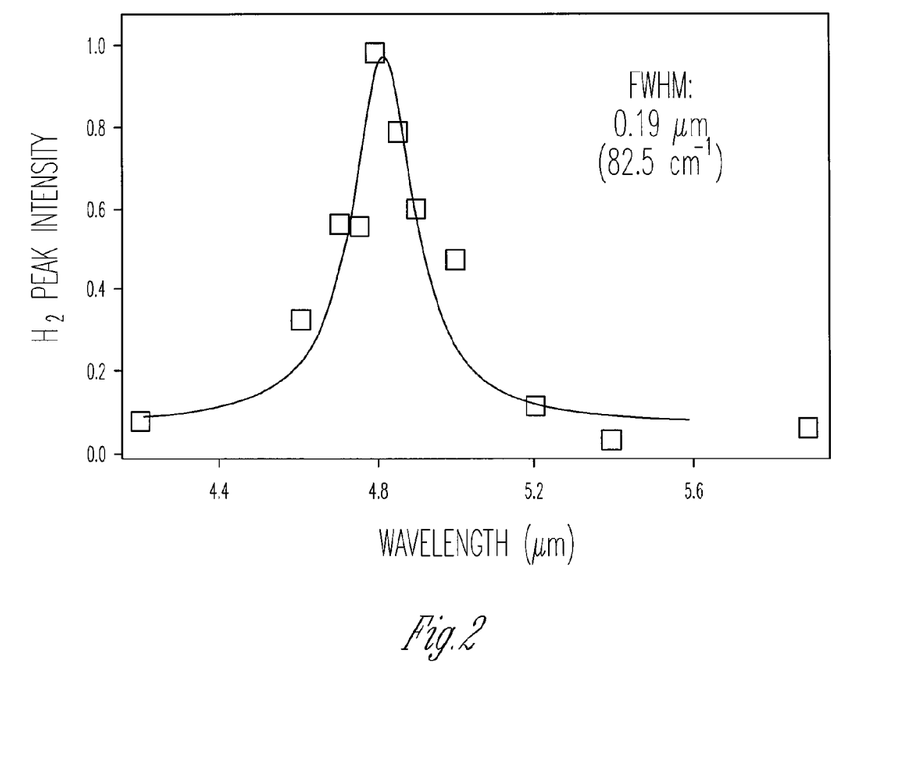
FIG. 2 illustrates the light wavelength dependence of the hydrogen-silicon chemical bond-cleavage yield.

The chemical bond-cleavage yield peaked at a wavelength of 4.8 μm (FIG. 2), corresponding to 0.26 eV, the energy of the vibrational stretch mode of the silicon-hydrogen chemical bond at the terrace sites of the silicon(111) surface. A Lorentzian fit yielded a full width at half maximum (FWHM) of 0.19 µm (82.5 cm$^{-1}$), close to the FEL linewidth, which is the limiting factor in resolving wavelength. Because the vibrational energy of the silicon-hydrogen chemical bond at the terrace site differs from that at the step site by 51.8 cm$^{-1}$, this resonance effect suggests that site-selective chemical bond-cleavage can be readily possible with an incident beam of appropriately narrow linewidth. In addition, chemical bond-cleavage was unobservable when the wavelength was far from resonance, ruling out a chemical bond-cleavage mechanism due to simple, direct laser heating.

Figure 3:
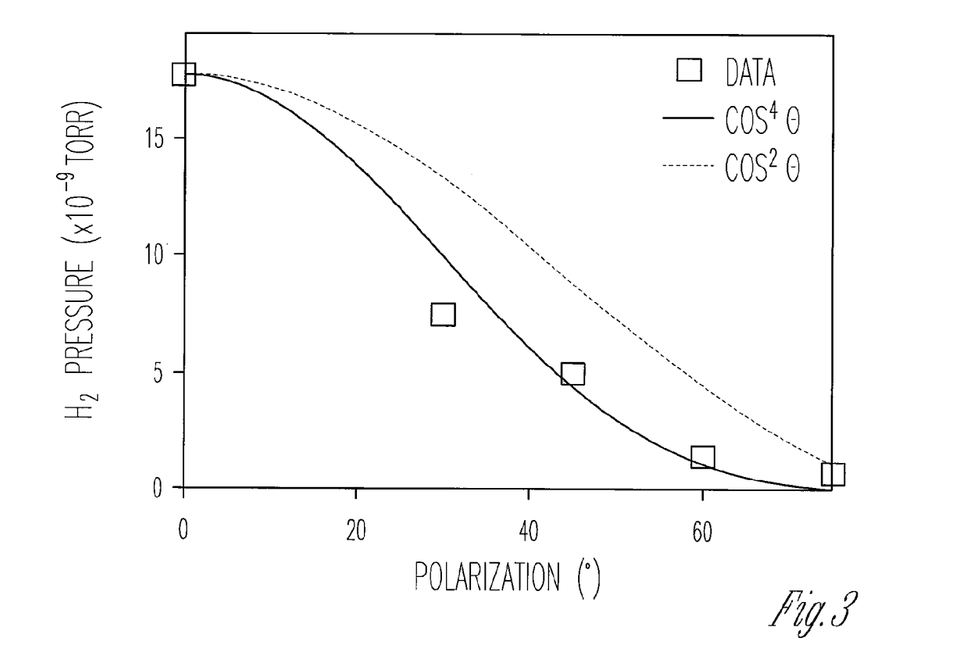
FIG. 3 illustrates the effect of light polarization on the yield of hydrogen-silicon chemical bond-cleavage.
Figure 4:
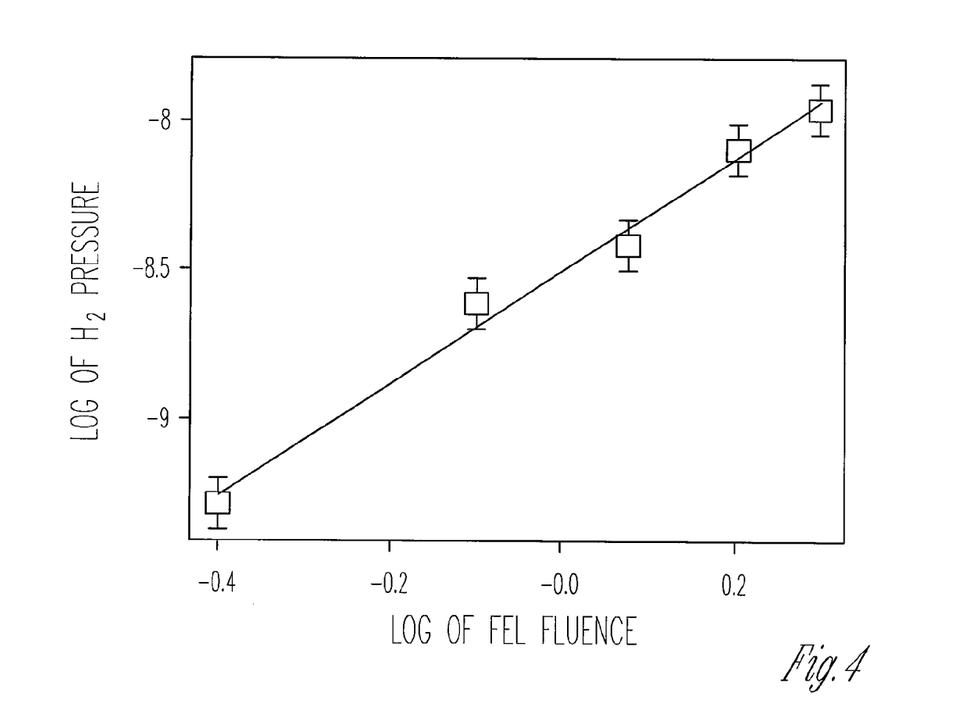
FIG. 4 illustrates the log-log plot of cleaved hydrogen-silicon chemical bonds versus FEL fluence.

A study of the polarization dependence of the chemical bond-cleavage yield can provide further insight into the chemical bond-cleavage mechanism. For bulk-like thermal processes, possibly due to impurities or defects, the chemical bond-cleavage yield is not expected to be very sensitive to the polarization angle. For direct chemical bond-cleavage processes via electronic excitation, the yield should be a simple quadratic function of the FEL electric field projected in the direction of silicon-hydrogen chemical bond, i.e., a linear dependence on the incident intensity, and follow a $\cos^2 \theta$ curve as illustrated (FIG. 3). In the experiment with constant FEL fluence, however, the chemical bond-cleavage yield scales with the incident polarization as $\cos^4 \theta$ (FIG. 3). This behavior indicates that the observed chemical bond-cleavage does not result from a thermal process caused by direct laser heating, but from the direct interaction between the incident field and the silicon-hydrogen chemical bonds. Furthermore, the $\cos^4 \theta$ dependence implies a quadratic dependence on the incident intensity, as verified in a direct measurement of the yield dependence on the FEL fluence (FIG. 4). This quadratic dependence is significantly different from the approximately 9th order dependence that can be observed in multiple vibrational excitations of silicon-hydrogen chemical bonds on silicon(100) by using a scanning tunneling microscope.

Figure 5:
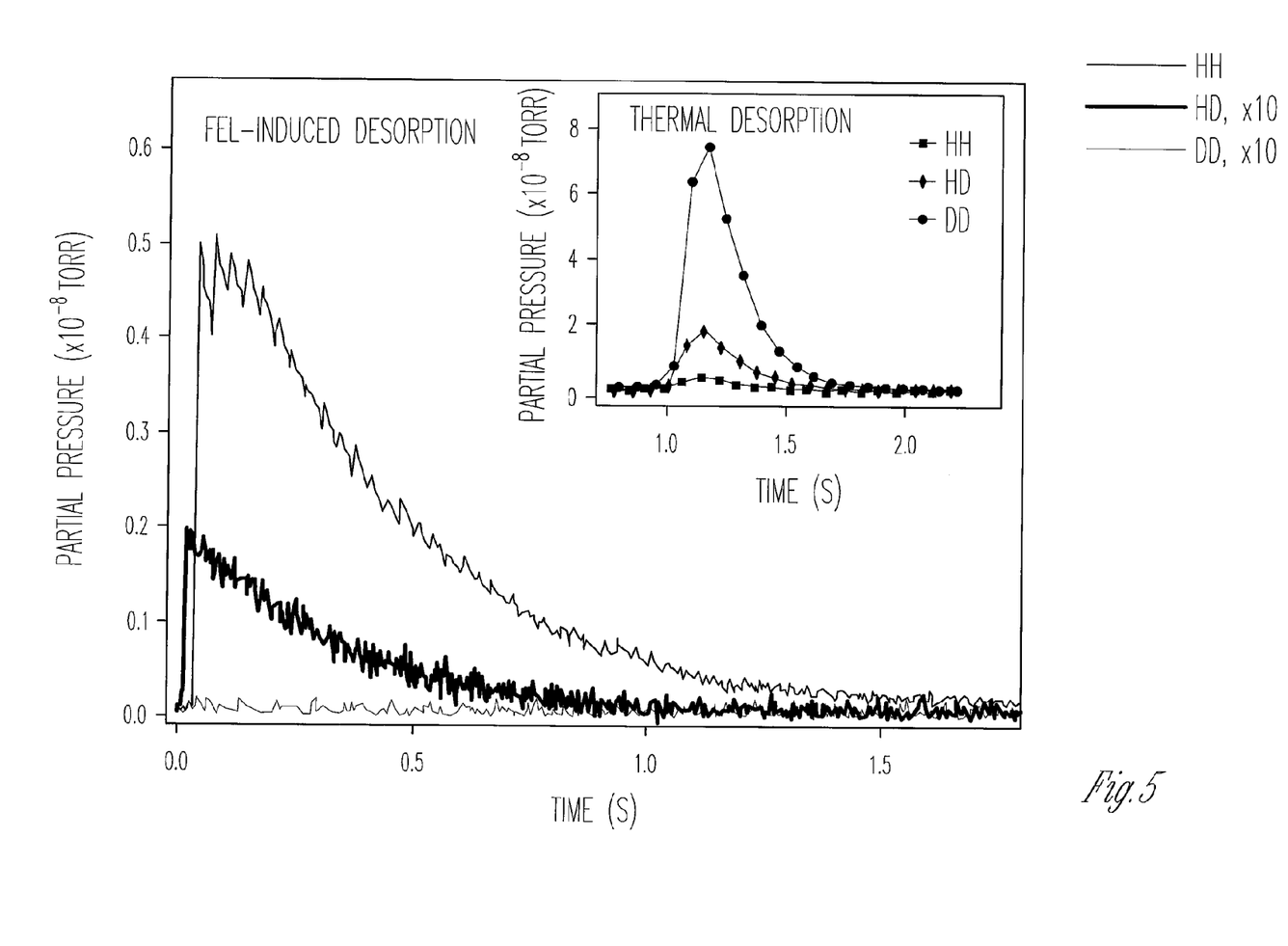
FIG. 5 illustrates the partial pressures of $H_2$, HD, and $D_2$ as a function of time, arising from FEL-induced chemical bond cleavage.
Figure 6:
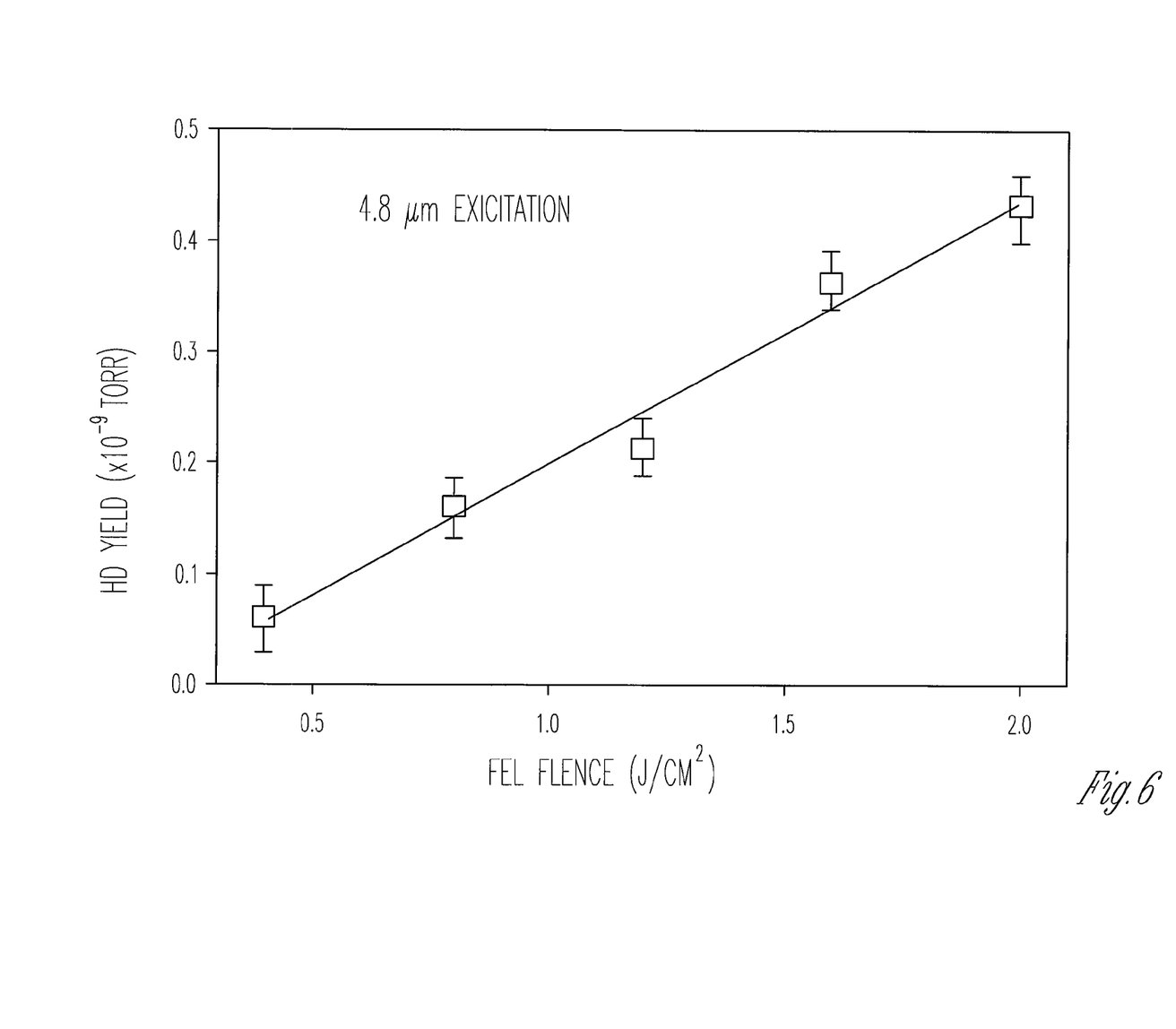
FIG. 6 illustrates the yield of HD as a function of FEL fluence.

To further probe the nature of the chemical bond-cleavage mechanism, the thermal chemical bond-cleavage and infrared light-induced chemical bond-cleavage of silica(111) chemically bound to a mixture of hydrogen and deuterium were also measured. Hydrogen and deuterium atoms were chemically bound to silica(111) and then the chemical bond-cleavage yields of different species were measured (FIG. 5). For thermal chemical bond-cleavage, the ratio of the yields was $H_2:HD:D_2=1:4.3:16.9$. In the FEL-induced process, with the same hydrogen and deuterium coverage and the wavelength tuned to the silicon-hydrogen chemical bond stretch at 4.8 µm, the chemical bond-cleavage ratio was found to be 1:0.04:0.005, in stark contrast to the thermal data. Furthermore, the HD chemical bond-cleavage yield was linear in photon flux (FIG. 6) over the same range in which the $H_2$ yield was seen to be quadratic. These results support very different mechanisms for thermal chemical bond-cleavage and infrared light-induced chemical bond-cleavage.

Example 1

Traditional PMA

The irradiation treatment can be used during the post metallization anneal (PMA) process. A PMA process can assist in the passivation of silicon dangling bonds by atomic hydrogen. For example, an anneal can last for one hour at a temperature of approximately 400° C., and can result in a real defect density of $(2-10) \times 10^9$ defects per square centimeter, for example see Stesmans, A *J. Appl. Phys.*, 2000, 88, 489-497. In a typical PMA process, hydrogen is introduced in two ways: as an ambient gas, and as material released from films and structures deposited in prior manufacturing steps.

Thus, in one example embodiment the wafer surface is irradiated during the PMA process. A deuterium ambient can be used to introduce deuterium to the wafer. Furthermore, deuterated films can be used to introduce deuterium to the dangling bonds. The backside of the wafer can be cleaned prior to the irradiation in order to allow for the greatest penetration of the energy (e.g. any nitride films, or other films, could be removed via either wet or dry etches), if the wafer is illuminated from the backside. Cleaning the backside can be useful due to numerous metal layers that can be present on the front side which can reflect the incident light. However, in some products (like, for example, analog linear circuits) this metallization can be minimal. In this case the wafer could be illuminated from the front side.

Example 2

The irradiation treatment can be employed at an earlier step than the PMA process during the manufacturing process, depending on the specifics of the manufacturing process being considered. For example, a partial listing of the manufacturing process can include the following steps: 1) Gate Oxidation, 2) Poly Silicon Deposition, 3) Dopant Implantation (gates, source and drain for both n-type and p-type, etc.), 4) Dopant Activation (~650° C. or higher).

At this stage, the c-Si/Silicon Dioxide interface is close to the surface of the wafer. Furthermore, once the transistors are formed the wafer can enter the "back end of line" processing, which can be characterized in part by lower processing temperatures. Thus, the passivated dangling bonds can be replaced at this stage of the process with deuterium, and due to the lower processing temperatures some deuterium bonds can survive the rest of the manufacturing process, reducing deuterium/hydrogen competition during PMA and improving the overall proportion of bonds that are passivated with deuterium.

The wafer can be irradiated while in a deuterium ambient (at least 5% deuterium, and as much as 100% deuterium) and at an elevated temperature (approximately 400° C.) for one hour. After the passivation, the normal manufacturing process can continue.

Due to many factors, including the variety and complexity of semiconductor processing, deuterium passivation can occur at a variety of times during the process, including occurring once or multiple times. For example, some processes call for source and drain implantation followed by silicon epitaxy. The temperature of the epitaxy can be sufficient to activate the source and drain dopants. If this were the final "high temperature" (any temperature greater than 600° C.) process, then the irradiation treatment can be performed. However, many semiconductor processes do not have silicon epitaxy. It should be evident that one of skill in the art can examine the manufacturing process in detail in order to ascertain at which point the treatment should place.

All publications, patents, and patent applications are incorporated herein by reference. While in the foregoing specification this disclosed subject matter has been described in relation to certain preferred embodiments thereof, and many details have been set forth for purposes of illustration, it will be apparent to those skilled in the art that the disclosed subject matter is susceptible to additional embodiments and that certain of the details described herein can be varied considerably without departing from the basic principles of the disclosed subject matter.

While the invention has been described and exemplified in sufficient detail for those skilled in this art to make and use it, various alternatives, modifications, and improvements will be apparent to those skilled in the art without departing from the spirit and scope of the claims.

What is claimed is:

1. A method of semiconductor device manufacture comprising:
   providing a semiconductor device, the semiconductor device being at least in part chemically bonded to an undesired chemical species;
   exposing the semiconductor device to a source of a desired chemical species; and,
   subjecting the semiconductor device to light of a wavelength of about 4.4 micrometers to about 5.2 micrometers sufficient to selectively cleave at least some of the chemical bonds between the semiconductor device and the undesired chemical species while cleaving less or no chemical bonds between the semiconductor device and the desired chemical species, such that the semiconductor device becomes at least in part chemically bonded to the desired chemical species.

2. The method of claim 1, wherein the semiconductor device comprises at least one semiconductor, wherein the at least one semiconductor comprises silicon.

3. The method of claim 1, wherein the semiconductor device comprises more than one semiconductor.

4. The method of claim 1, wherein at least part of the exposure of the semiconductor device to the source of the desired chemical species and at least part of the subjection of the semiconductor device to the light take place.

5. The method of claim 1, wherein the undesired chemical species comprises H.

6. The method of claim 1, wherein the desired chemical species comprises D.

7. The method of claim 1, wherein the desired chemical species comprises a halogen atom.

8. The method of claim 1, wherein the source of the desired chemical species comprises a gas that provides the desired chemical species.

9. The method of claim 1, wherein the source of the desired chemical species comprises a source that provides the desired chemical species mixed with an inert carrier.

10. The method of claim 1, wherein the source of the desired chemical species comprises $D_2$.

11. The method of claim 1, wherein the source of the desired chemical species comprises $D_2O$.

12. The method of claim 1, wherein the semiconductor device is at an intermediate stage of manufacturing.

13. The method of claim 1, wherein the wavelength of the light is in the infrared region.

14. The method of claim 1, wherein the wavelength of the light is about 4.8 micrometers.

15. The method of claim 1, wherein the light is polarized.

16. The method of claim 1, wherein the light is polarized at about 0 degrees.

17. The method of claim 1, wherein before and alternatively or additionally after manufacturing the semiconductor device comprises one or more of an MOS device, a transistor, a MOSFET, a TFT, a diode, an LED, a polysilicon resistor, a bipolar device, an integrated circuit, a microprocessor, memory including RAM or ROM memory, an analog circuit, a sensor, a solar cell, a photovoltaic, or a mixture thereof.

18. The method of claim 1, wherein the desired chemical species comprises at least one of: D, F, Cl, Br, I, NO, $NO_2$, a hydrocarbon, a nitrogen-containing compound, or a combination thereof.

19. The method of claim 1, wherein the source of the desired chemical species comprises at least one of: $D_2$, $D_2O$, $CD_4$, $CDCl_3$, $CD_2Cl_2$, $SiD_4$, $SiDCl_3$, $SiCl_2D_2$, $ND_3$, DCl, acetone-$d_6$, acetonitrile-$d_3$, $CD_3OD$, DMSO-$d_6$, DMF-$d_7$, benzene-$d_6$, cyclohexane-$d_{12}$, pyridine-$d_5$, a deuterated hydrocarbon, a deuterated amine, a deuterated nitrogen-containing compound, deuterium radicals, deuterium ions, a deuterium plasma, or a combination thereof.

20. The method of claim 1, wherein the desired chemical species is desired to be chemically bonded to the semiconductor device in place of the undesired chemical species.

21. The method of claim 1, further comprising formation of a deuterium reservoir film on said semiconductor device.

22. The method of claim 21, wherein the deuterium reservoir film is a source of deuterium for up to the lifetime of the semiconductor device.

23. The method of claim 21, wherein deuterium is the desired chemical species, and wherein a deuterium reservoir film is the source of the desired chemical species.

24. The method of claim 1, wherein the further steps of manufacturing the semiconductor device do not include temperatures which exceed the temperature required to dissociate the chemical bonds between the semiconductor device and the desired species.

25. The method of claim 1, further comprising heating to a temperature appropriate to increase the rate of diffusion of the undesired chemical species out of the semiconductor device and to increase the rate of diffusion of the desired chemical species into the semiconductor device.

26. The method of claim 1, further comprising heating the semiconductor device to a temperature appropriate to assist with the cleavage of chemical bonds between the semiconductor device and the undesired chemical species.

27. The method of claim 1, further comprising heating to a temperature of approximately 400 degrees C.

28. The method of claim 1, further comprising the use of a magnetic field, an electrical field, a bias, or a combination thereof, to increase the rate of diffusion of the undesired chemical species out of the semiconductor device.

29. A method of semiconductor device passivation, comprising:
   providing a semiconductor device, the semiconductor device being at least in part chemically bonded to hydrogen;
   exposing the semiconductor device to a source of deuterium; and,
   subjecting the semiconductor device to light of a wavelength of about 4.4 micrometers to about 5.2 micrometers sufficient to selectively cleave at least some of the chemical bonds to hydrogen while cleaving less or no chemical bonds between the semiconductor device and deuterium, such that the semiconductor device becomes at least in part chemically bound to deuterium in place of hydrogen.

30. The method of claim 29, wherein the source of deuterium comprises at least one of: $D_2$, $D_2O$, $CD_4$, $CDCl_3$, $CD_2Cl_2$, $SiD_4$, $SiDCl_3$, $SiCl_2D_2$, $ND_3$, DCl, acetone-$d_6$, acetonitrile-$d_3$, $CD_3OD$, DMSO-$d_6$, DMF-$d_7$, benzene-$d_6$, cyclohexane-$d_{12}$, pyridine-$d_5$, a deuterated hydrocarbon, a deuterated amine, a deuterated nitrogen-containing compound, deuterium radicals, deuterium ions, a deuterium plasma, or a combination thereof.

* * * * *

UNITED STATES PATENT AND TRADEMARK OFFICE
CERTIFICATE OF CORRECTION

| | | |
|---|---|---|
| PATENT NO. | : 8,569,149 B2 | Page 1 of 1 |
| APPLICATION NO. | : 12/775228 | |
| DATED | : October 29, 2013 | |
| INVENTOR(S) | : Roy Meade | |

It is certified that error appears in the above-identified patent and that said Letters Patent is hereby corrected as shown below:

In the Claims

In column 13, line 31, in Claim 4, delete "place." and insert -- place concurrently. --, therefor.

Signed and Sealed this
Twenty-eighth Day of January, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,569,149 B2  Page 1 of 1
APPLICATION NO. : 12/775228
DATED : October 29, 2013
INVENTOR(S) : Roy Meade

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 586 days.

Signed and Sealed this
Twenty-third Day of May, 2017

Michelle K. Lee
*Director of the United States Patent and Trademark Office*